(12) United States Patent
Dai (10) Patent No.: US 10,126,788 B2
(45) Date of Patent: Nov. 13, 2018

(54) FULL-ACCESS CASE FOR RECEIVING SERVER

(71) Applicant: HONGFUJIN PRECISION ELECTRONICS (TIANJIN) CO.,LTD., Tianjin (CN)

(72) Inventor: Ju-Wen Dai, TianJin (CN)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 15/621,046

(22) Filed: Jun. 13, 2017

(65) Prior Publication Data
US 2018/0275726 A1    Sep. 27, 2018

(30) Foreign Application Priority Data

Mar. 23, 2017 (CN) .......................... 2017 1 0176827

(51) Int. Cl.
| | |
|---|---|
| *H05K 5/03* | (2006.01) |
| *G06F 1/18* | (2006.01) |
| *H05K 7/14* | (2006.01) |
| *G11B 33/12* | (2006.01) |
| *G11B 33/02* | (2006.01) |
| *E06B 3/42* | (2006.01) |

(52) U.S. Cl.
CPC ............ *G06F 1/182* (2013.01); *G11B 33/027* (2013.01); *G11B 33/127* (2013.01); *H05K 5/03* (2013.01); *H05K 7/1492* (2013.01); *E06B 3/42* (2013.01); *G11B 33/126* (2013.01)

(58) Field of Classification Search
CPC ........ H05K 5/03; H05K 7/1492; G06F 1/182; G11B 33/027; G11B 33/127; E05D 15/26; E05D 15/264
USPC ... 312/297, 109, 223.1, 223.2, 139.1, 139.2, 312/25, 208.3; 220/255, 811, 812; 49/98, 103, 125, 127
See application file for complete search history.

(56) References Cited

U.S. PATENT DOCUMENTS

| | | | |
|---|---|---|---|
| 446,647 A * | 2/1891 | Rankin | |
| 625,852 A * | 5/1899 | Sanders | |
| 1,742,821 A * | 1/1930 | Nichols | ................ A47B 17/036 206/214 |
| 6,863,358 B2 * | 3/2005 | Beyer | ..................... E06B 3/482 312/297 |
| 2015/0061482 A1 * | 3/2015 | Yu | ........................ H05K 5/0226 312/326 |
| 2015/0201522 A1 * | 7/2015 | Jau | ....................... G11B 33/128 312/330.1 |
| 2017/0150621 A1 * | 5/2017 | Breakstone | ......... G06F 13/4022 |

* cited by examiner

*Primary Examiner* — James O. Hansen
(74) *Attorney, Agent, or Firm* — ScienBiziP, P.C.

(57) ABSTRACT

A case for servers or other devices allowing full access without disassembly includes housing and sliding cover. A receiving space in housing includes a first space and a second space. The sliding cover is in two parts. The first part sliding cover covers the first space and the second part sliding cover covers the second space. The first part sliding cover can slide out of the receiving space to allow the second covering body to move to the empty space. The first part sliding cover is rotatable around the second part to expose one half portion of the case. When the first part slides out of the receiving space to rotate to being above the second part, the second part can slide so as to uncover the remaining half portion of the case.

20 Claims, 7 Drawing Sheets

FULL-ACCESS CASE FOR RECEIVING SERVER

CROSS-REFERENCE TO RELATED APPLICATIONS

This application claims priority to Chinese Patent Application No. 201710176827.1, filed on Mar. 23, 2017, the contents of which are incorporated by reference herein.

FIELD

The subject matter herein generally relates to cases for receiving servers.

BACKGROUND

Data centers include cases and a number of servers. The case includes a cover and a housing. The cover is locked to the housing. When replacing the server, the cover must be disassembled from the housing.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein. The disclosure is illustrated by way of example and not by way of limitation in the figures of the accompanying drawings, in which like references indicate similar elements. It should be noted that references to "an" or "one" exemplary embodiment in this disclosure are not necessarily to the same exemplary embodiment, and such references mean at least one.

The term "comprising" means "including, but not necessarily limited to"; it specifically indicates open-ended inclusion or membership in a so-described combination, group, series, and the like.

FIGS. 1 to 5 illustrate a case 100 including a housing 20 and a sliding cover 30. The sliding cover 30 is slidably attached to the housing 20. The housing 20 defines a receiving space 22. The receiving space 22 is configured to receive a number of electronic devices 60. The electronic device 60 can be a server. The sliding cover 30 includes a first covering body 32, a second covering body 34 and a connecting member 40 connected between the first covering body 32 and the second covering body 34. The receiving space 22 includes a first space 24 and a second space 26. The first covering body 32 and the second covering body 34 are positioned on the first space 24 and the second space 26 to cover and shield the receiving space 22. The first covering body 32 and the second covering body 34 are slidably attached to the housing 20. The first covering body 32 can slide on the housing 20 along a first direction, and thus be positioned out of the receiving space 22. When the first covering body 32 slides out of the receiving space 22, the second covering body 34 can move to the first space 24 and expose the second space 26. Thus, the electronic device 60 in the second space 26 can be taken out for replacement.

Figure 4:
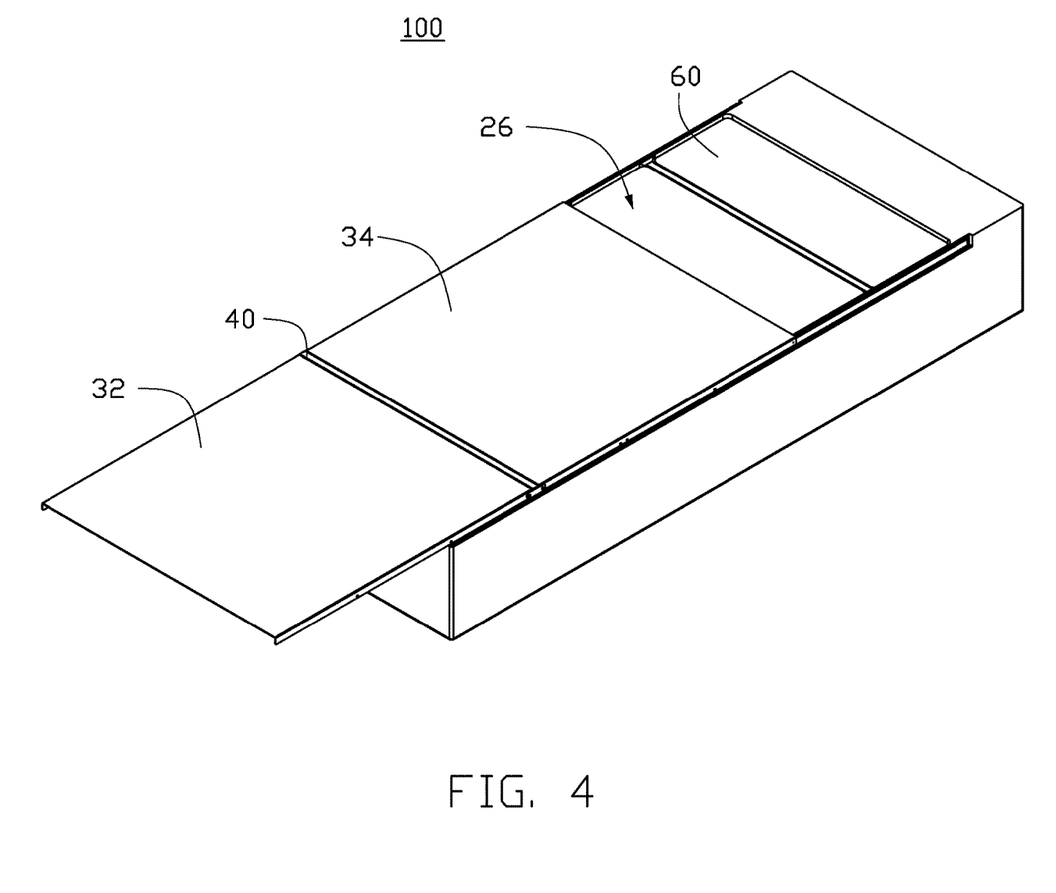
FIG. 4 is an isometric view of all of the first covering body sliding out of the receiving space and rotating on a second covering body in the case of FIG. 1.
Figure 5:
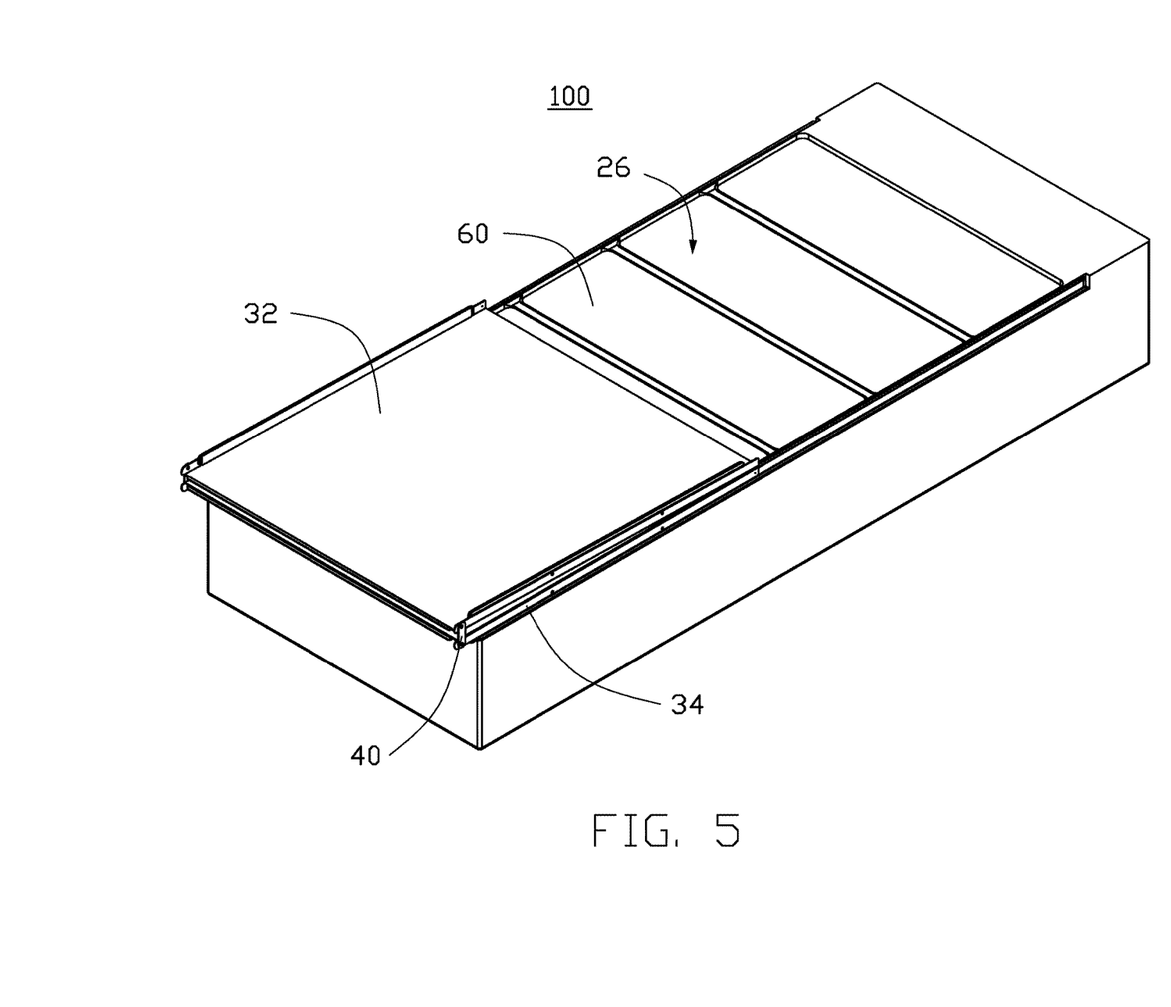
FIG. 5 is an isometric view of the second covering body sliding to a second accepting space in the case of FIG. 1.

The first covering body 32 is rotatably connected to the connecting member 40. When the first covering body 32 slides out of the receiving space 22, the first covering body 32 rotates to a preset angle relative to the second covering body 34, to be positioned above the second covering body 34. When the first covering body 32 is positioned above the second covering body 34, the second covering body 34 slides along a second direction opposite to the first direction, to shield the second space 26 and expose the first space 24. Thus, the electronic device 60 in the first space 24 can be taken out for replacement. The preset angle is 180 degrees. When the first covering body 32 slides out of the receiving space 22, the first covering body 32 rotates 180 degrees to be positioned on the second covering body 34.

FIG. 5 illustrates that the connecting member 40 includes a main body 42, two first rotating members 44, and two second rotating members 46. The main body 42 is positioned between the first covering body 32 and the second covering body 34. The first rotating members 44 are rotatably connected to the main body 42 and the first covering body 32. The second rotating members 46 are rotatably connected to the main body 42 and the second covering body 34.

The main body 42 defines two first through holes 41 and two second through holes 43. An edge of the first covering body 32 adjacent to the second covering body 34 defines two first penetration holes 31. The first penetration holes 31 are aligned with the first through holes 41. Each first rotating member 44 is fixed in one of the first through holes 41 and one of the first penetration holes 31, to rotatably connect the first covering body 32 to the connecting member 40. An edge of the second covering body 34 adjacent to the first covering body 32 defines two second penetration holes 33. The second penetration holes 33 are aligned with the second through holes 43. Each second rotating member 46 is fixed in one of the second through holes 43 and in one of the second penetration holes 33, to rotatably connect the second covering body 34 to the connecting member 40. The first rotating member 44 and the second rotating member 46 are rivets.

Figure 1:
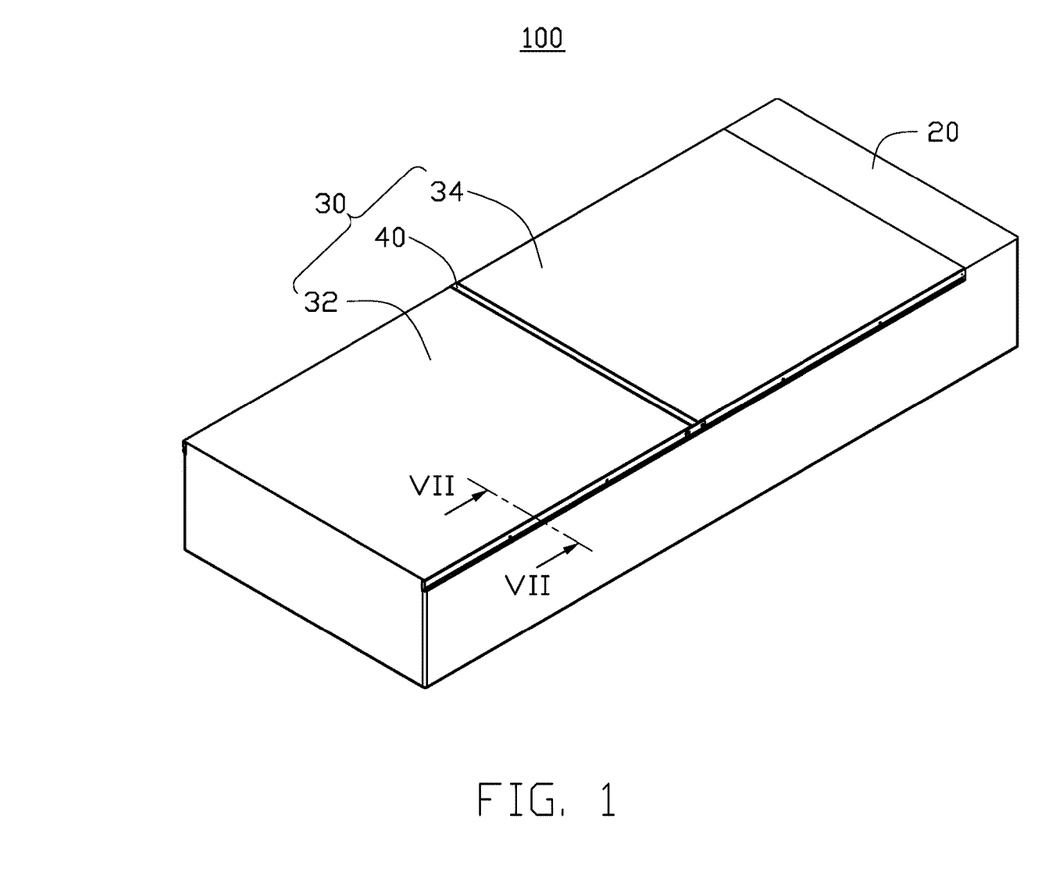
FIG. 1 is an isometric view of an exemplary embodiment of a case for receiving servers.
Figure 2:
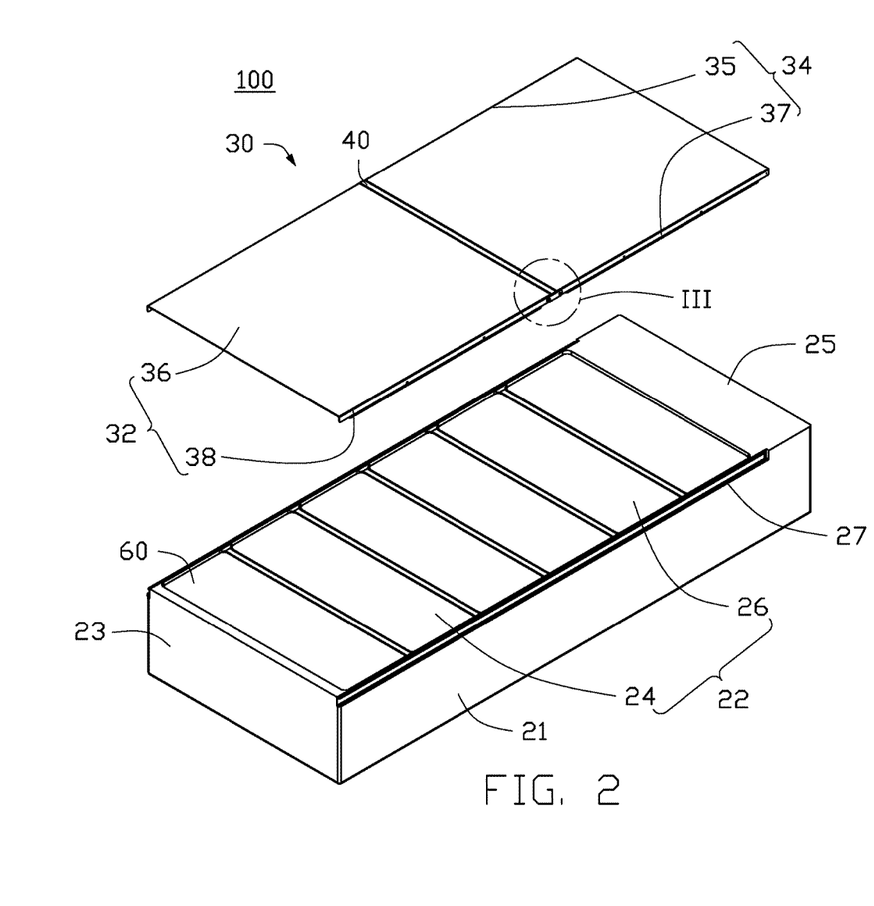
FIG. 2 is an exploded view of an exemplary embodiment of the case for receiving servers.
Figure 3:
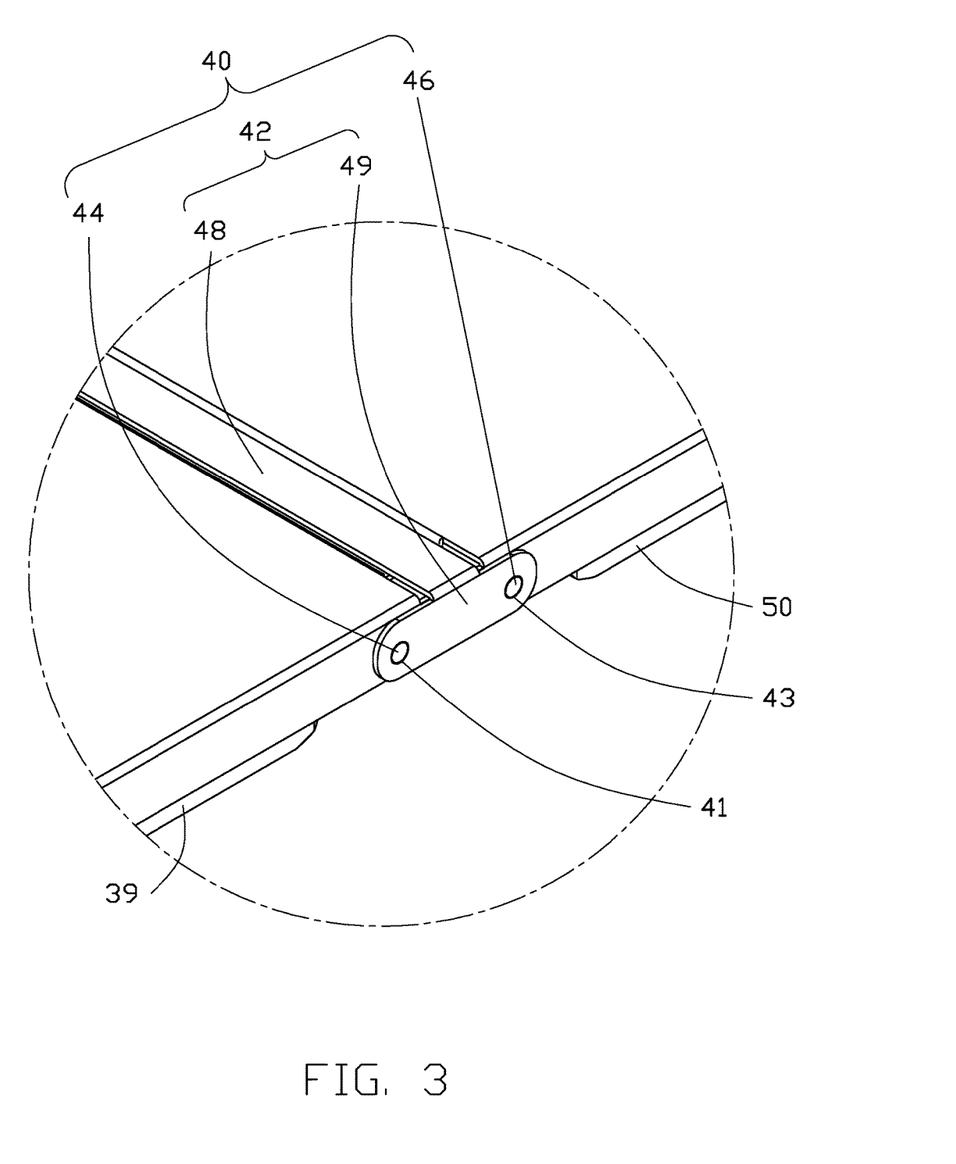
FIG. 3 is an isometric view of a part of a first covering body sliding out of a receiving space in the case of FIG. 1.

Also referring to FIG. 1, the first covering body 32 includes a first covering plate 36 and two first edgefolds 38. A first edgefold 38 extends from each opposing edge of the first covering plate 36. The second covering body 34 includes a second covering plate 35 and two second edgefolds 37. A second edgefold 37 extends from each opposing edge of the second covering plate 35. The two first edgefolds 38 define the two first penetration holes 31. The two second edgefolds 37 define the two second penetration holes 33. The main body 42 includes a strip 48 and two fixing pieces 49 perpendicularly extended from two ends of the strip 48. Each fixing piece 49 defines one of the first through holes 41 and one of the second through holes 43.

The housing 20 includes opposite two first lateral plates 21, a second lateral plate 23, and a third lateral plate 25. The second lateral plate 23 connects front ends of the two first lateral plates 21. The third lateral plate 25 connects rear ends of the two first lateral plates 21. The first lateral plate 21 defines two parallel sliding grooves 27. The sliding grooves 27 extend from the front end of the first lateral plate 21 up to the rear end of the first lateral plate 21. The first covering body 32 and the second covering body 34 slide away from the third lateral plate 25 along the sliding grooves 27 to be removed from the housing 20.

Figure 6:
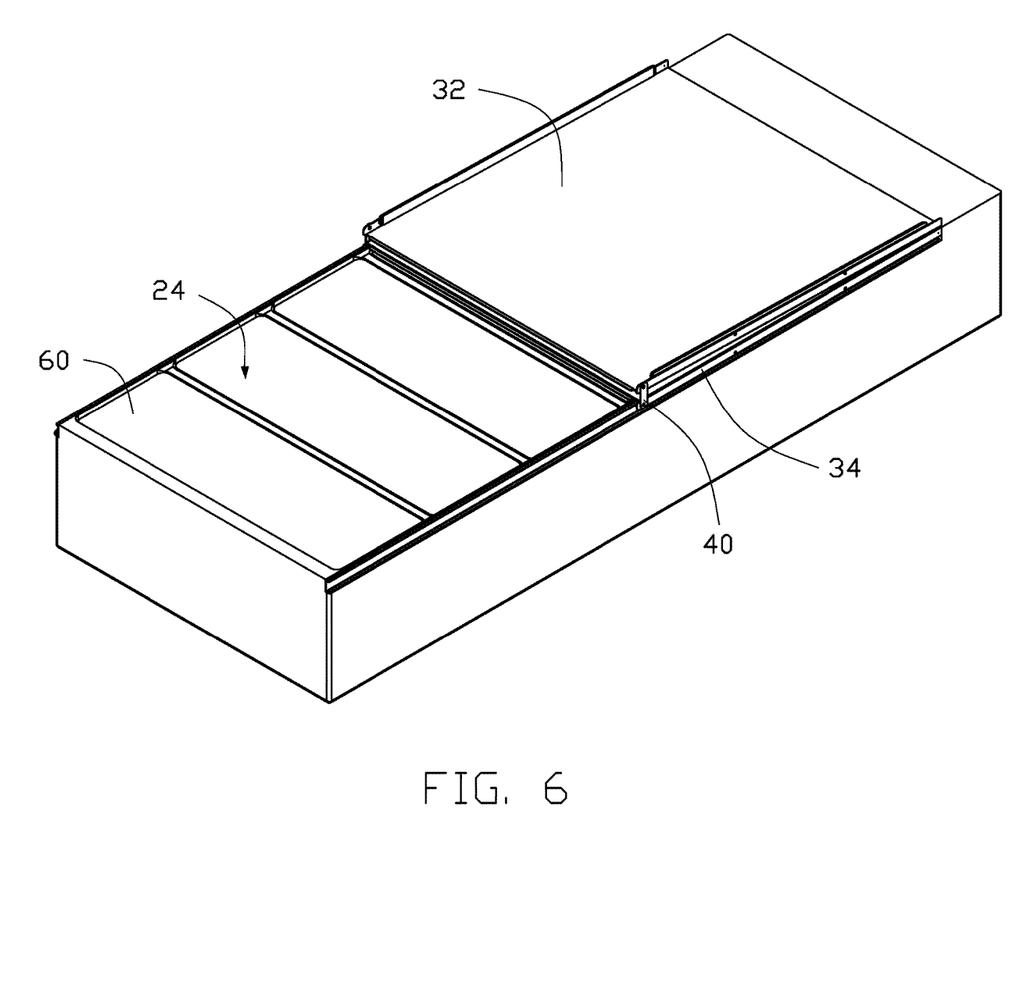
FIG. 6 is an isometric view of a connecting member connected to a sliding cover in the case of FIG. 1.
Figure 7:
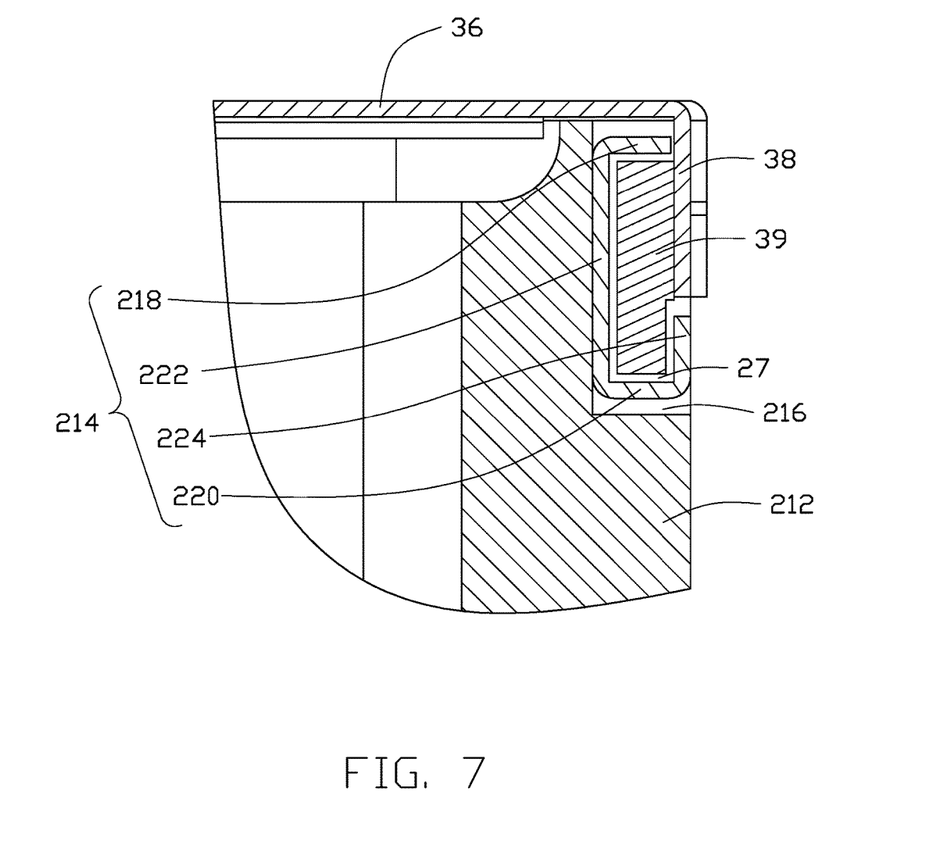
FIG. 7 is a cross-section view along VII-VII of the sliding cover connected to a sliding rail in the case of FIG. 1.

FIG. 6 illustrates that each first lateral plate 21 includes a plate body 212 and a sliding rail 214. Two plate bodies 212 define two parallel receiving grooves 216. A sliding rail 214 is fixed in each of the two receiving grooves 216. The sliding groove 27 is defined on the sliding rail 214. Each sliding rail 214 includes a top rail 218, a bottom rail 220, a connecting rail 222, and a restricting rail 224. The top rail 218 and the bottom rail 220 are parallel to the sliding cover 30. The connecting rail 222 connects the top rail 218 and the bottom rail 220. The restricting rail 224 extends upward from the bottom rail 220. The top rail 218, the bottom rail 220, the connecting rail 222, and the restricting rail 224 together define the sliding groove 27. The top rail 218 abuts the first edgefold 38 and the second edgefold 37. The restricting rail 224 faces the first edgefold 38 and the second edgefold 37. The first covering body 32 further includes a first sliding block 39 positioned at an inner side of the first edgefold 38. FIG. 5 illustrates the second covering body 34 which further includes a second sliding block 50. The first sliding block 39 and the second sliding block 50 are positioned on the bottom rail 220 and between the connecting rail 222 and the restricting rail 224.

The exemplary embodiments shown and described above are only examples. Even though numerous descriptions and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims.

What is claimed is:

1. A case comprising:
   a housing defining a receiving space, the receiving space comprising a first space and a second space;
   a sliding cover comprising:
      a first covering body positioned on the first space and slidably attached to the housing;
      a second covering body positioned on the second space and slidably attached to the housing;
      a connecting member connected between the first covering body and the second covering body;
   wherein the first covering body is slidable on the housing along a first direction to be positioned out of the receiving space to allow the second covering body to move to the first space; the first covering body is rotatably connected to the connecting member; and when the first covering body slides out of the receiving space, the first covering body rotates a preset angle to be positioned above the second covering body and the second covering body slides along a second direction, that is opposite to the first direction, to shield the second space and allow the first space to be exposed.

2. The case as claimed in claim 1, wherein the preset angle is 180 degrees.

3. The case as claimed in claim 1, wherein the connecting member comprises a main body, two first rotating members, and two second rotating members; the main body is positioned between the first covering body and the second covering body; the first rotating members are rotatably connected to the main body and the first covering body; and the second rotating members are rotatably connected to the main body and the second covering body.

4. The case as claimed in claim 3, wherein the main body defines two first through holes and two second through holes; an edge of the first covering body adjacent to the second covering body defines two first penetration holes; and the two first penetration holes are aligned with the two first through holes; and one of the first rotating members is fixed in one of the first through holes and one of the first penetration holes rotatably connects the first covering body to the connecting member.

5. The case as claimed in claim 4, wherein the first rotating member is a rivet.

6. The case as claimed in claim 4, wherein the main body comprises a strip and two fixing pieces perpendicularly extending from two ends of the strip; and each fixing piece defines one of the first through holes.

7. The case as claimed in claim 1, wherein the housing comprises opposite two first lateral plates, a second lateral plate, and a third lateral plate; the second lateral plate connects front ends of the two first lateral plates; the third lateral plate connects rear ends of the two first lateral plates; the two first lateral plates define two parallel sliding grooves; and each sliding groove extends from a front end of the first lateral plate and stops before a rear end of the first lateral plate, the first covering body and the second covering body slide away from the third lateral plate along the sliding groove to leave from the housing.

8. The case as claimed in claim 7, wherein each first lateral plate comprise a plate body and a sliding rail, two plate bodies define two parallel receiving grooves, two sliding rails are fixed in the two receiving grooves; and the sliding groove is defined on the sliding rail.

9. The case as claimed in claim 8, wherein each sliding rail comprises a top rail, a bottom rail, a connecting rail and a restricting rail, the top rail and the bottom rail are parallel to the sliding cover, the connecting rail connects the top rail and the bottom rail, the restricting rail extends upward from the bottom rail; and the top rail, the bottom rail, the connecting rail and the restricting rail together define the sliding groove.

10. The case as claimed in claim 9, wherein the first covering body comprises a first covering plate, two first edgefolds, and a first sliding block; the two first edgefolds extend from opposite two edges of the first covering plate; and the first sliding block is attached to an inner side of one of the first edgefolds, and the first sliding block is positioned on the bottom rail and between the connecting rail and the restricting rail.

11. A case comprising:
a housing defining a receiving space, the receiving space comprising a first space and a second space;
a sliding cover slidablay attached to the housing and comprising:
a first covering body positioned on the first space;
a second covering body positioned on the second space;
wherein the first covering body is slidable on the housing along a first direction to be positioned out of the receiving space to allow the second covering body to move to the first space; the first covering body is rotatable around the second covering body; and when the first covering body slides out of the receiving space, the first covering body rotates 180 degrees to be positioned on the second covering body and the second covering body slides along a second direction, that is opposite to the first direction, to shield the second space and allow the first space to be exposed.

12. The case as claimed in claim 11, wherein the sliding cover further comprises a connecting member connected between the first covering body and the second covering body; and the first covering body is rotatably connected the connecting member.

13. The case as claimed in claim 12, wherein the connecting member comprises a main body, two first rotating members and two second rotating members; the main body is positioned between the first covering body and the second covering body; the first rotating members are rotatably connected the main body and the first covering body; and the second rotating members are rotatably connected to the main body and the second covering body.

14. The case as claimed in claim 13, wherein the main body defines two first through holes and two second through holes; an edge of the first covering body adjacent to the second covering body defines two first penetration holes; the two first penetration holes are aligned with the two first through holes; and one of the first rotating members is fixed in one of the first through holes and one of the first penetration holes to rotatably connect the first covering body to the connecting member.

15. The case as claimed in claim 14, wherein the first rotating member is a rivet.

16. The case as claimed in claim 14, wherein the main body comprises a strip and two fixing pieces perpendicularly extending from two ends of the strip; and each fixing piece defines one of the first through holes.

17. The case as claimed in claim 11, wherein the housing comprises opposite two first lateral plates, a second lateral plate and a third lateral plate; the second lateral plate connects front ends of the two first lateral plates, the third lateral plate connects rear ends of the two first lateral plates, the two first lateral plates define two parallel sliding grooves, each sliding groove extends from a front end of the first lateral plate and stops before a rear end of the first lateral plate, the first covering body and the second covering body slide away from the third lateral plate along the sliding groove to leave from the housing.

18. The case as claimed in claim 17, wherein each first lateral plate comprise a plate body and a sliding rail, two plate bodies define two parallel receiving grooves, two sliding rails are fixed in the two receiving grooves; and the sliding groove is defined on the sliding rail.

19. The case as claimed in claim 18, wherein each sliding rail comprises a top rail, a bottom rail, a connecting rail and a restricting rail, the top rail and the bottom rail are parallel to the sliding cover, the connecting rail connects the top rail and the bottom rail, the restricting rail extends upward from the bottom rail; and the top rail, the bottom rail, the connecting rail and the restricting rail together define the sliding groove.

20. The case as claimed in claim 19, wherein the first covering body comprises a first covering plate, two first edgefolds, and a first sliding block; the two first edgefolds extend from opposite two edges of the first covering plate; and the first sliding block is attached to an inner side of one of the first edgefolds, and the first sliding block is positioned on the bottom rail and between the connecting rail and the restricting rail.

* * * * *